United States Patent
Bronner et al.

(10) Patent No.: US 6,339,001 B1
(45) Date of Patent: Jan. 15, 2002

(54) FORMULATION OF MULTIPLE GATE OXIDES THICKNESSES WITHOUT EXPOSING GATE OXIDE OR SILICON SURFACE TO PHOTORESIST

(75) Inventors: Gary B. Bronner, Stormville, NY (US); Jeffrey P. Gambino, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/595,817

(22) Filed: Jun. 16, 2000

(51) Int. Cl.[7] .......................................... H01L 21/8234
(52) U.S. Cl. ........................ 438/275; 438/287; 438/981
(58) Field of Search ................................ 438/275, 276, 438/279, 287, 591, 981, 770

(56) References Cited

U.S. PATENT DOCUMENTS

| 5,057,449 A | * 10/1991 | Lowrey et al. ............. 438/275 |
| 5,444,279 A | 8/1995 | Lee |
| 5,498,577 A | 3/1996 | Fulford, Jr. et al. |
| 5,668,035 A | 9/1997 | Fang et al. |
| 5,821,169 A | 10/1998 | Nguyen et al. |
| 5,882,993 A | 3/1999 | Gardner et al. |
| 5,926,708 A | 7/1999 | Martin |
| 6,080,682 A | * 6/2000 | Ibok ............................. 438/770 |
| 6,117,736 A | * 9/2000 | Kapoor ........................ 438/279 |
| 6,165,849 A | * 12/2000 | An et al. ..................... 438/275 |

FOREIGN PATENT DOCUMENTS

| JP | 58-100450 A | * 6/1983 |
| JP | 10326837 A | 12/1997 |

* cited by examiner

Primary Examiner—Michael Trinh
(74) Attorney, Agent, or Firm—McGinn & Gibb, PLLC; Ira D. Blecker, Esq.

(57) ABSTRACT

A method and structure for forming an integrated circuit chip having multiple-thickness gate dielectrics includes forming a gate dielectric layer over a substrate, forming a sacrificial layer over the gate dielectric layer, forming first openings through the sacrificial layer to expose the gate dielectric layer in the first openings, growing a first gate dielectric having a thickness greater than that of the gate dielectric layer in the first openings, depositing a first gate conductor above the first gate dielectric in the first openings, forming a second opening through the sacrificial layer to expose the gate dielectric layer in the second opening, and depositing a second gate conductor in the second opening.

7 Claims, 4 Drawing Sheets

FORMULATION OF MULTIPLE GATE OXIDES THICKNESSES WITHOUT EXPOSING GATE OXIDE OR SILICON SURFACE TO PHOTORESIST

BACKGROUND OF THE INVENTION

1. Field of the Invention

The present invention generally relates to the formation of semiconductor devices and more particularly to a method and structure which includes gate oxides having multiple thicknesses.

2. Description of the Related Art

Conventional systems such as those shown in U.S. Pat. Nos. 5,444,279 and 5,489,577 (incorporated herein by reference) manufacture gate oxides using methods that incorporate an impurity implant patterned with a photoresist mask to form multiple thicknesses of gate oxides. They also use enhanced oxidation by Boron doping. This is not useful for advanced CMOS devices because the high doping in the channel can adversely affect the threshold voltage of the device.

More specifically, such conventional systems use photoresists to selectively implant an impurity and then either remove or form a gate oxide over the regions having different impurity levels. The impurities cause the oxide to grow (or be removed) at a different rate and permit a gate oxide with different thicknesses to be manufactured.

The different gate oxide thicknesses allow different gates or different portions of the gate to be closer to the underlying silicon substrate, which results in decreased coupling between the gate and the transistor channel region. Such processes also make the devices easier to program because the higher impurity concentrations increase the number of hot electrons available in some situations. The thicker gate oxides provide better insulation for a floating gate and reduce the number of electrons which may leak from the floating gate. This increases the charge storage ability of a floating gate and improves the reliability of the device.

However, these processes typically expose the gate oxide to impurities from the photoresist. More specifically, sodium, potassium, iron, nickel, etc. are transferred from the photoresist to the underlying gate oxide. These impurities affect the threshold voltage of the gate oxide, leading to variations in the transistor current-voltage characteristics. Further, high concentrations of these impurities can lead to high leakage currents through the gate oxide, degrading yield and reliability. Therefore, it is difficult to make manufacturing changes to compensate for the impurities and is also difficult to calculate the effect the impurities will have upon the threshold voltage of the gate oxide. Thus, there is a need to eliminate such photoresist impurities from the gate oxide during the formation of multi-thickness gate oxides.

The invention described below forms multiple gate film thickness without exposing the gate oxide to the photoresist. Therefore, the invention produces a structure with different gate oxide thicknesses without suffering the disadvantages of conventional processes.

SUMMARY OF THE INVENTION

It is, therefore, an object of the present invention to provide a structure and method for forming an integrated circuit chip having multiple-thickness gate dielectrics. The method includes forming a gate dielectric layer over a substrate, forming a sacrificial layer over the gate dielectric layer, forming first openings through the sacrificial layer to expose the gate dielectric layer in the first openings, growing a first gate dielectric having a thickness greater than that of the gate dielectric layer in the first openings, depositing a first gate conductor above the first gate dielectric in the first openings, forming a second opening through the sacrificial layer to expose the gate dielectric layer in the second opening, and depositing a second gate conductor in the second opening.

The structure and method include forming shallow trench isolation regions within the substrate wherein the first opening and the second opening are formed between the shallow trench isolation regions which form a first sacrificial layer and a second sacrificial layer over the first sacrificial layer. The first sacrificial layer is the material that is selectively etchable with respect to the gate dielectric layer. After depositing the second gate conductor, the first sacrificial layer is removed so that the second sacrificial layer is simultaneously removed. After depositing the first gate conductor the sacrificial layer is planarized. The first gate conductor has a thickness less than that of the second gate conductor.

The invention also includes a process for forming an integrated circuit chip having multiple-thickness gate dielectrics which includes forming gate mandrels on a substrate, forming an insulator between the gate mandrels, selectively removing first ones of the gate mandrels to form first openings in the insulator, forming a first gate dielectric within the first openings, depositing a first gate conductor within the first openings and above the first gate dielectric, selectively removing second ones of the gate mandrels to form second openings in the insulator, forming a second gate dielectric within the second openings (the second gate dielectric having a thicknesses less than the first gate dielectric), and depositing the second gate conductor within the second openings above the second gate dielectric.

The inventive structure comprises an integrated circuit chip with first devices having a first gate dielectric with a first gate dielectric thickness, second devices having a second gate dielectric with a second gate dielectric thickness less than the first gate dielectric thickness, wherein the first gate dielectric and the second gate dielectric are free of photoresist impurities.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
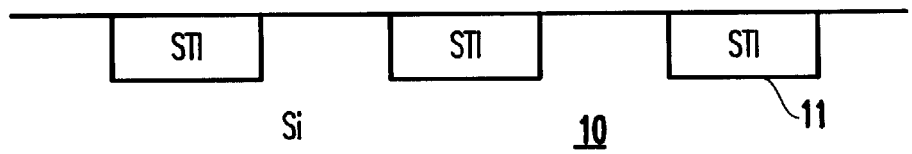
FIG. 1 is a schematic diagram of a stage of the method of producing a first embodiment of the invention.

As mentioned above, the conventional systems that form multiple-thickness gate oxides suffer from the disadvantage that photoresist impurities are allowed to remain in the gate oxides. The invention avoids this problem by forming the different gate oxide thicknesses in different processing steps without requiring a doping implant to achieve the different thicknesses. Therefore, the invention produces a structure with different gate oxide thicknesses wherein the oxides are free from impurities. This allows of the inventive structure to be superior to conventional structures in that the gate oxide will be a pure insulator (e.g., free from unwanted photoresist related impurities) and will perform as projected by the modeling program, once the structure is actually manufactured. Additionally, the gate oxide will comprise a consistent material which acts consistently throughout the entire circuit or chip.

Referring now to the drawings, and more particularly to FIGS. 1–8, one process for manufacturing a first embodiment of the invention is illustrated. While, at first glance, it may appear that the foregoing problem can be simply solved by including an additional passivating layer, such as polysilicon between the gate oxide and the photoresist mask to protect the gate oxide from the impurities in the photoresist, as is shown in U.S. Pat. No. 5,668,035, incorporated herein by reference. However, the formation and removal of such a passivating material over the gate oxide results in substantial manufacturing problems which produces undesirable yield results. Therefore, the following high yield processes have been developed which allows impurity-free gate oxides to be formed with multiple thicknesses.

More specifically, as shown in FIG. 1, shallow trench isolation (STI) regions 11 are formed within a substrate 10 (such as a silicon substrate). The formation of the STI regions 11 includes patterning trenches using conventional lithographic and etching processes. An insulator is then deposited over the structure and in the trenches. The structure is then planarized to allow the insulator to remain only within the trenches.

Figure 2:
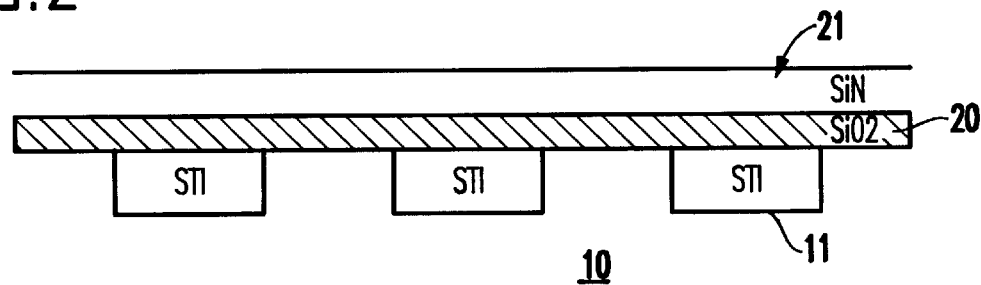
FIG. 2 is a schematic diagram of a stage of the method of producing a first embodiment of the invention.

In FIG. 2, a thermal oxide 20 such as a silicon oxide is grown over the structure. Then, a sacrificial film 21 (that is different than silicon oxide) is deposited. The sacrificial film 21 preferably has properties that will enable it to act as a mask to the thermal oxide 20. Further, the sacrificial film 21 should be selectively etchable with respect to the thermal oxide film 20. In the preferred embodiment shown in FIG. 2, the sacrificial film 21 comprises silicon nitride.

Figure 3:
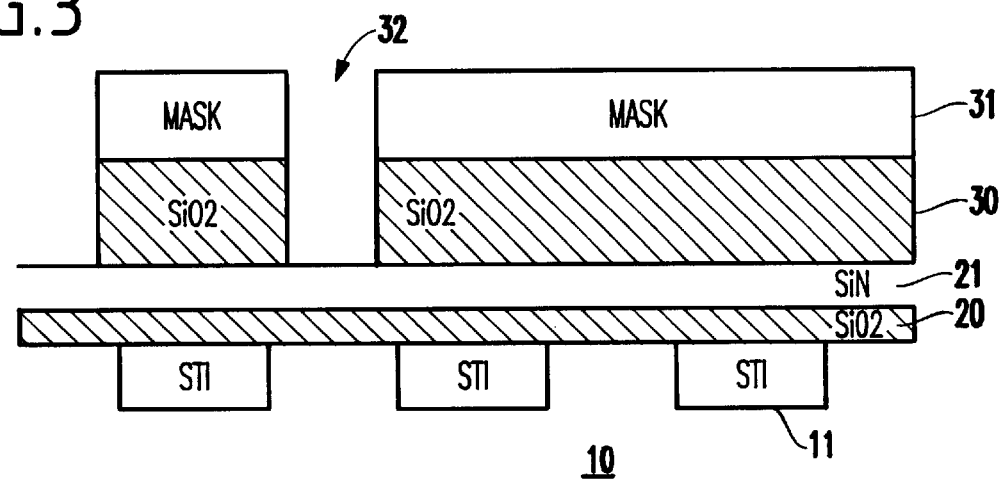
FIG. 3 is a schematic diagram of a stage of the method of producing a first embodiment of the invention.

In FIG. 3, a sacrificial oxide film 30 is deposited over the previous sacrificial film 21 and a mask 31 is formed over the sacrificial oxide 30. Using standard lithographic techniques, the mask is patterned and openings 32 are formed in the sacrificial oxide 30, as shown in FIG. 3. The openings 32 correspond with areas where "thick gate oxide" gate stack structures will be positioned over the thermal oxide 20.

Figure 4:
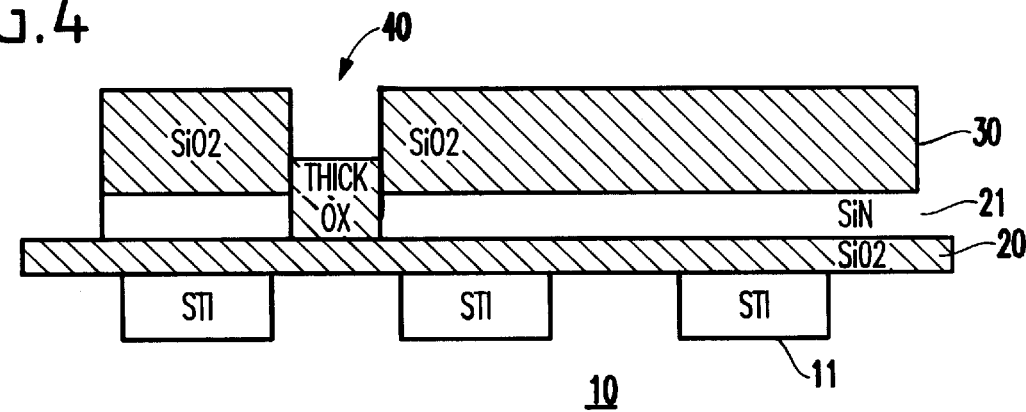
FIG. 4 is a schematic diagram of a stage of the method of producing a first embodiment of the invention.

In FIG. 4, the sacrificial film 21 is removed from the openings 32, using conventional removal techniques such as wet or dry etching. Then, a thermal oxidation process is performed to increase in the thickness of the thermal oxide layer 20 in the region of the openings 32 to form a thick region of thermal oxide 40 over the original thermal oxide layer 20, as shown in FIG. 4. Alternatively, the thermal oxide 20 can be removed (e.g., by a wet etch (AF-based)) from the openings 32 and a thick region of thermal oxide can be grown in the openings 32. This is the preferred embodiment because the resulting single thick gate oxide layer can be more easily controlled.

Figure 5:
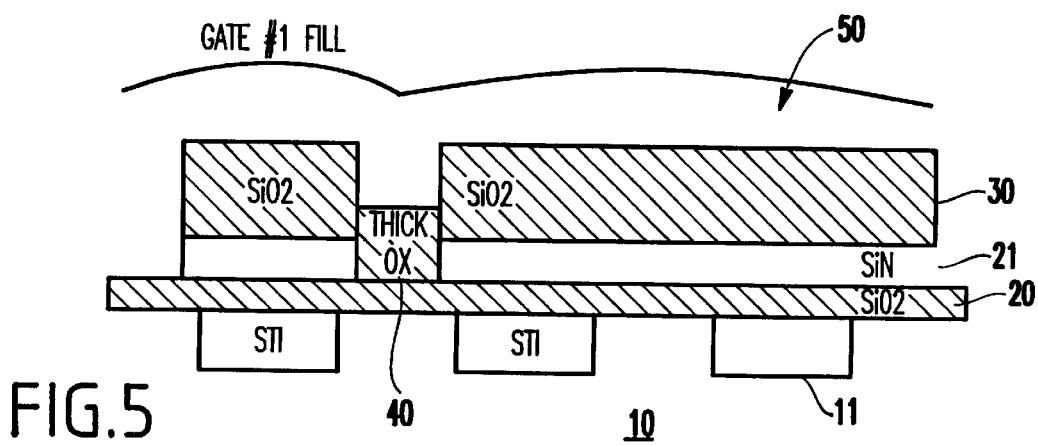
FIG. 5 is a schematic diagram of a stage of the method of producing a first embodiment of the invention.
Figure 6:
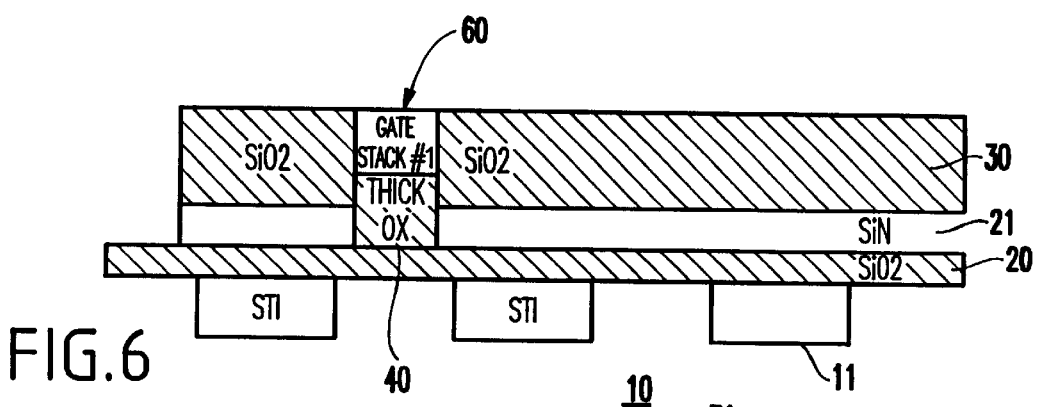
FIG. 6 is a schematic diagram of a stage of the method of producing a first embodiment of the invention.

Then, as shown in FIG. 5, a gate conductor 50 (e.g., polysilicon, tungsten, etc.) is deposited. As shown in FIG. 6, the structure is planarized using conventional techniques such as chemical mechanical polishing (CMP).

Figure 7:
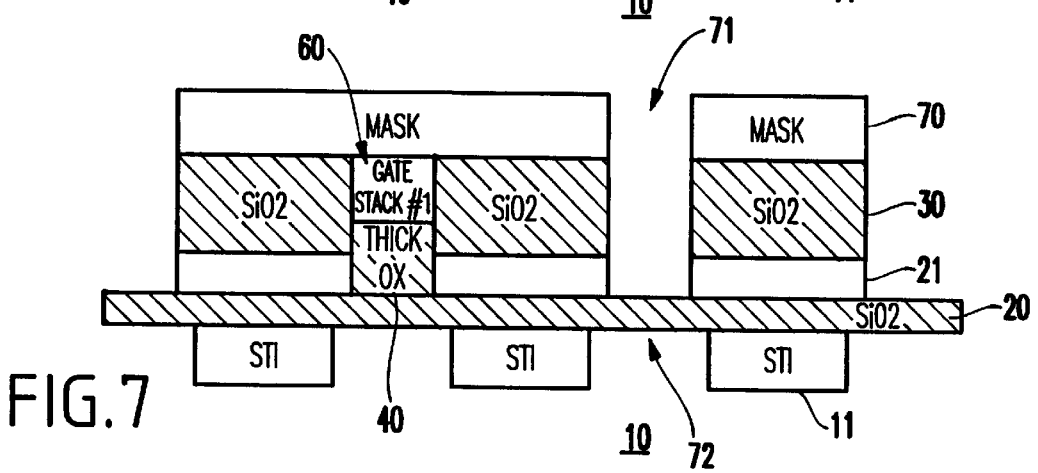
FIG. 7 is a schematic diagram of a stage of the method of producing a first embodiment of the invention.
Figure 8:
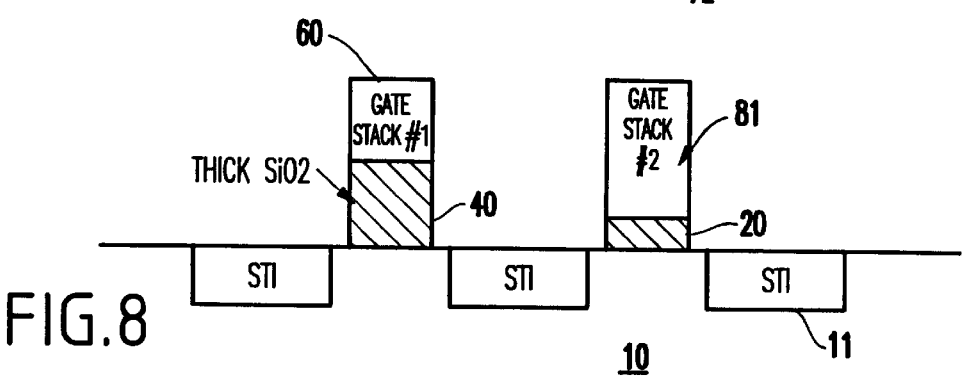
FIG. 8 is a schematic diagram of a stage of the method of producing a first embodiment of the invention.

In FIG. 7, another mask 70 is formed over the structure. The mask is patterned to form openings 71 where the "thin gate oxide" gate stack structures will be located. The sacrificial oxide 30 and sacrificial film 21 are removed from the openings 71, as discussed above with respect to opening 32. Alternatively, the thermal oxide 20 can be removed by a wet etch and a different thin gate oxide 72 can be grown in opening 71. In a similar manner to that shown in FIGS. 5 and 6, the opening 71 is then filled with a conductor (shown in FIG. 8 as item 81). The sacrificial oxide is then removed leaving the gate stack structures 40, 60 72, and 81. After this process, the conventional processes which form the source, drain and other features of the device, which are well known to those ordinarily skilled in the art, are performed.

This process forms gate stack structures which have different gate oxide thicknesses (and different gate conductor thicknesses) without utilizing a doping implant process and without using a resist in direct contact with the gate oxide. Therefore, the gate oxide structures are free from any doping impurities and do not suffer from the disadvantages of the conventional systems that are discuss above.

The previous embodiment formed the gate stack first and then formed the associated source and drain regions. In the next embodiment, the source and drain regions are formed before the gate stack. This second embodiment presents an advantage in that high dielectric contact materials (e.g., $Ta_2O_5$, $BaSrTiO_3$, etc.) can be used in the gate stack. In the previous embodiment such high dielectric contact materials could not be used because the high temperature anneals that are used to activate the source/drain junctions would degrate the gate dielectric (e.g., $Ta_2O_5$, and $BaSrTiO_3$ degrade at anneal temperatures above 700–900° C.).

Figure 9:
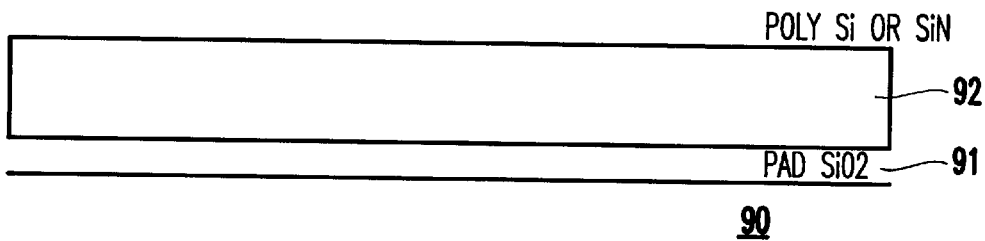
FIG. 9 is a schematic diagram of a final stage of the method of producing a first embodiment of the invention.
Figure 10:
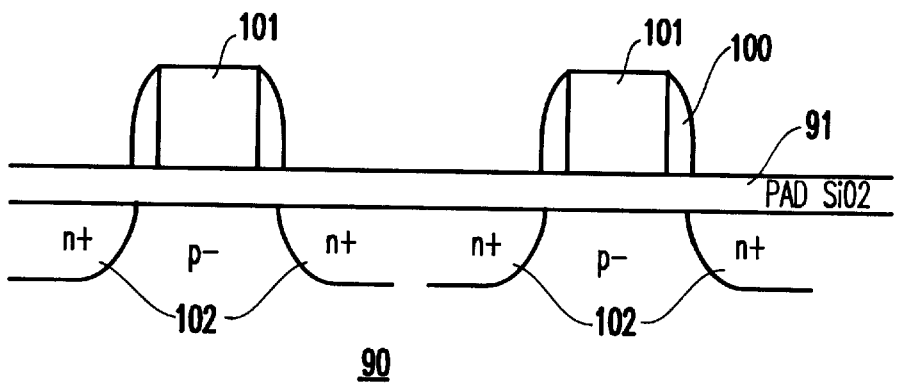
FIG. 10 is a schematic diagram of a stage of the method of producing a second embodiment of the invention.

The process for manufacturing this embodiment of the invention is shown in FIGS. 9–14. In FIG. 9, a pad silicon oxide 91 is grown over a substrate 90 and a gate conductor mandrel material 92 (e.g., polysilicon, silicon nitride, etc.) is deposited. Using conventional lithographic masking and etching techniques well known to those ordinarily skilled in the art, the mandrels 101 (e.g., gate conductor placeholders) are patterned out of the gate conductor mandrel material 92. In addition, conventional techniques are used to formed the spacers 100 on the sides of the gate conductor mandrels 101. Also, at this time, the source and drain regions 102 are implanted with an impurity.

Figure 11:
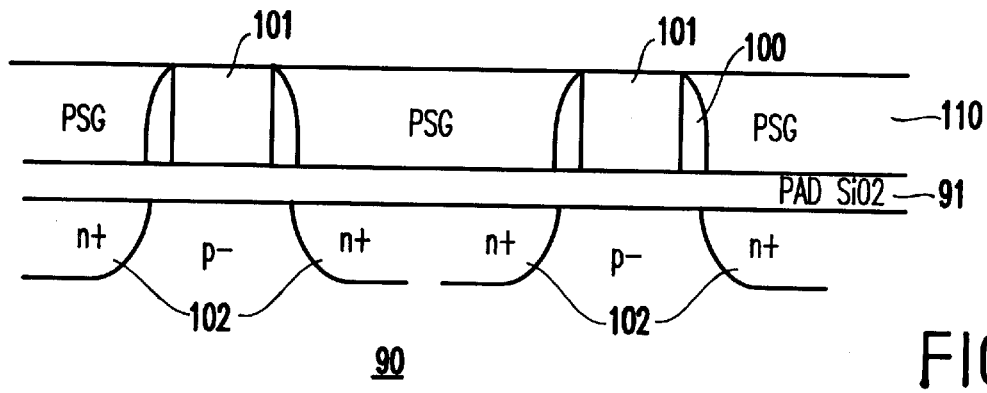
FIG. 11 is a schematic diagram of a stage of the method of producing a second embodiment of the invention.
Figure 12:
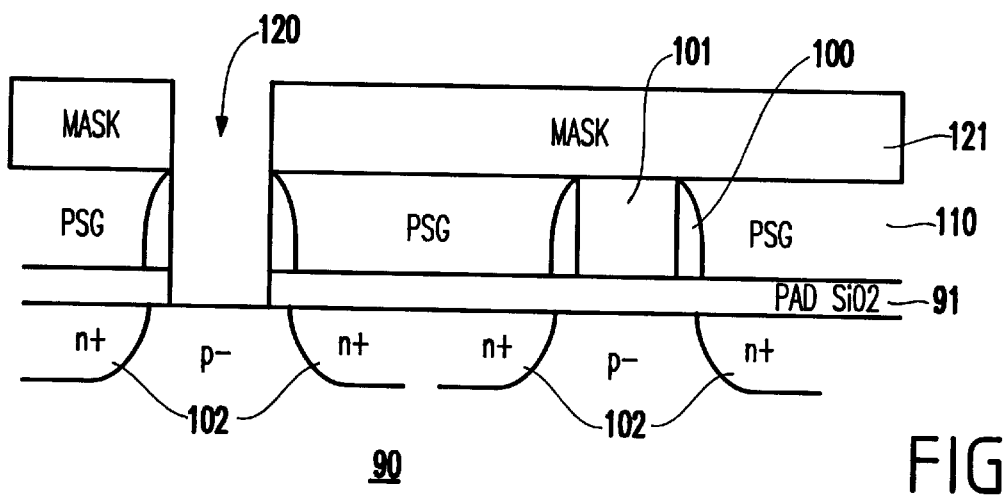
FIG. 12 is a schematic diagram of a stage of the method of producing a second embodiment of the invention.
Figure 13:
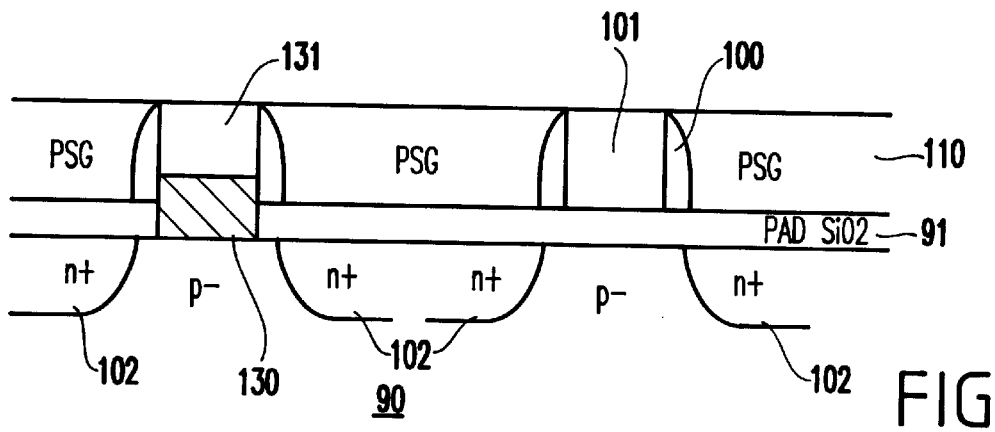
FIG. 13 is a schematic diagram of a stage of the method of producing a second embodiment of the invention.

In FIG. 11, an insulator 110 is deposited and planarized. In a preferred embodiment, the insulator comprises PSG (Phosphoro Silicate Glass). In FIG. 12, a mask 121 is formed over the structure and patterned to reveal opening 120. Then, the gate material mandrels 101 and insulator 91 are removed from the opening 120, using conventional removal techniques such as wet or dry etching. In FIG. 13, the thicker dielectric 130 is grown in the opening 128. Then, the gate conductor 131 is deposited over the gate oxide 130 in the opening of 120. Then, the structure is planarized using any conventional planarizing technique to remove any excess conductor material 131. The mask 121 can be removed in the foregoing planarization process or can be removed in a separate step.

Figure 14:
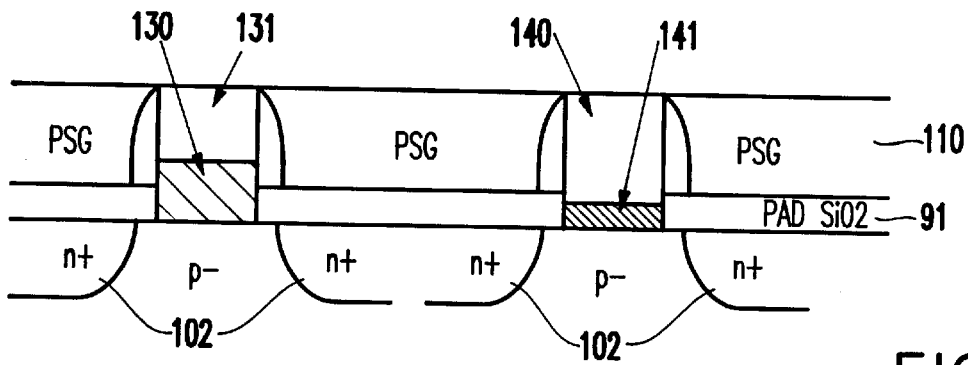
FIG. 14 is a schematic diagram of a final stage of the method of producing a second embodiment of the invention.

Next, a mask (not illustrated) similar to that shown in FIG. 12 is formed over the structure with an opening over the regions where the thin gate conductor oxide will be located. The previous mandrel material 101 is removed to form openings similar to openings 120 shown in FIG. 12. In addition, the thermal oxide 91 is removed with a wet etch. The mask protects the thicker gate oxide 130 and gate conductor 131 during these etch steps. Then, as shown in FIG. 14, a thin gate dielectric 141 (e.g., $Ta_2O_5$, $Ta_2O_5$, $BaSrTiO_3$, etc.) is deposited over the entire structure. Subsequently, the gate conductor 140 is deposited and the entire structure is subjected to a planarization process which removes any excess gate dielectric 141 or gate conductor 140 and produces the structure shown in FIG. 14.

Since the gate oxides and gate conductors are formed in different processing steps, the invention also allows the opportunity to utilize different materials for the different gate oxides and the different gate conductors. Therefore, the invention allows the circuit designer even greater flexibility when compared to conventional processes.

Therefore, and shown above, the invention produces a structure which includes a gate oxide material that is free of impurities commonly found in photoresist materials. Further, the invention presents a process of forming such structures. Therefore, the invention produces a semiconductor device, such as a transistor that includes gate oxide layers having different thicknesses. Also, the inventive gate oxide layers have a consistent material composition (being free of photoresist impurities) which allows the inventive structure to operate in a more consistent manner and to be free of defects.

An additional benefit of the invention is that the structure is very planar, which makes it easier to process subsequent contact and metal layers. This is in contrast to the prior art, for example, such as U.S. Pat. No. 5,668,035, which results in a non-planar structure.

While the invention has been described in terms of preferred embodiments, those skilled in the art will recognize that the invention can be practiced with modification within the spirit and scope of the appended claims.

What is claimed is:

1. A method of forming an integrated circuit chip having multiple-thickness gate dielectrics, said method comprising:
    forming a gate dielectric layer over a substrate;
    forming a sacrificial layer over said gate dielectric layer;
    forming first openings through said sacrificial layer to expose said gate dielectric layer in said first openings;
    growing a first gate dielectric having a thickness greater than that of said gate dielectric layer in said first openings;
    depositing a first gate conductor above said first gate dielectric in said first openings;
    forming a second opening through said sacrificial layer to expose said gate dielectric layer in said second opening; and
    depositing a second gate conductor in said second opening.

2. The method in claim 1, further comprising forming shallow trench isolation regions within said substrate, wherein, said first opening and said second opening are formed between said shallow trench isolation regions.

3. The method in claim 1, wherein said forming of said sacrificial layer comprises forming a first sacrificial layer and forming a second sacrificial layer over said first sacrificial layer.

4. The method in claim 3, wherein said first sacrificial layer comprises a material that is selectively etchable with respect to said gate dielectric layer.

5. The method in claim 4, further comprising, after said depositing of said second gate conductor, removing said first sacrificial layer such that said second sacrificial layer is simultaneously removed.

6. The method in claim 1, further comprising after said depositing of said first gate conductor, planarizing said sacrificial layer.

7. The method in claim 1, wherein said first gate conductor has a thickness less than that of said second gate conductor.

* * * * *